United States Patent
Quach (10) Patent No.: US 8,627,252 B2
(45) Date of Patent: Jan. 7, 2014

(54) METHOD FOR SELECTIVELY IMPLEMENTING LOW THRESHOLD VOLTAGE TRANSISTORS IN DIGITAL LOGIC DESIGNS

(75) Inventor: Le Tu Quach, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 1144 days.

(21) Appl. No.: 12/233,191

(22) Filed: Sep. 18, 2008

(65) Prior Publication Data
US 2010/0070933 A1    Mar. 18, 2010

(51) Int. Cl.
*G06F 17/50* (2006.01)
(52) U.S. Cl.
USPC ............................. 716/113; 716/104; 716/126
(58) Field of Classification Search
USPC .......................................... 716/104, 113, 126
See application file for complete search history.

(56) References Cited

U.S. PATENT DOCUMENTS

| 7,257,781 | B2 | 8/2007 | Coughlin, Jr. |
| 7,284,215 | B1 * | 10/2007 | Kim et al. ..................... 716/119 |
| 7,340,712 | B2 | 3/2008 | Correale, Jr. |
| 7,797,646 | B2 * | 9/2010 | Chung et al. ................... 716/113 |
| 2004/0051556 | A1 * | 3/2004 | Shimazaki et al. ............. 326/80 |

\* cited by examiner

*Primary Examiner* — Thuan Do
(74) *Attorney, Agent, or Firm* — Polsinelli PC (57) ABSTRACT

A system and method for selectively replacing standard threshold voltage devices with low threshold voltage devices in a digital logic design. The system identifies at least one path having a first timing value, the path having a plurality of standard threshold devices. The path is reverse traversed, or otherwise analyzed or traversed, to identify at least one of the standard threshold devices to possibly replace with a corresponding low threshold device. The system also determines a timing value for the path associated with replacing the at least one standard threshold device with the corresponding low threshold device. Depending the analysis, the standard threshold device may be replaced with a low threshold device, such as when the path timing improves by replacement. Such replacement may be used in various paths, such as paths considered critical paths in a digital logic design.

20 Claims, 8 Drawing Sheets

| Slack (in ps) | Edge | Instance Name | Original cell type | LVT cell name | Improved by (in ps) | Path number |
|---|---|---|---|---|---|---|
| -824 | RISING | frame_ior | ch_ior | NO LVT CELL | n/a | 1 |
| -824 | RISING | I523/Irepm57_48x_1 | ch_nt_buf_repm57a_48x | ch_ntlv_buf_repm57a_48x | 18.2 | 1 |
| -824 | RISING | I1337/I7 | ch_nt_buf_repm7c_48x | ch_ntlv_buf_repm7c_48x | 20 | 1 |
| -824 | RISING | I1262/I7 | ch_nt_buf_repm7c_48x | ch_ntlv_buf_repm7c_48x | 18.7 | 1 |
| -824 | RISING | I263/I4 | ch_nt_buf_repm7b_48x | ch_ntlv_buf_repm7b_48x | 14.2 | 1 |
| -824 | RISING | I377/Irepm35_32x_28 | ch_nt_buf_repm35a_32x | ch_ntlv_buf_repm35a_32x | 15.1 | 1 |
| -824 | RISING | I974/Irepm46_48x_9 | ch_nt_buf_repm46a_48x | ch_ntlv_buf_repm46a_48x | 23.7 | 1 |
| -824 | RISING | I759/Irepm4_32x_18 | ch_nt_buf_repm4a_32x | ch_ntlv_buf_repm4a_32x | 20.1 | 1 |
| -824 | RISING | I1762/Irepm4_32x_3 | ch_nt_buf_repm4a_32x | ch_ntlv_buf_repm4a_32x | 23.3 | 1 |
| -824 | RISING | I113/Irepm46_48x_12 | ch_nt_buf_repm46a_48x | ch_ntlv_buf_repm46a_48x | 25.4 | 1 |
| -824 | RISING | I101/Irepm46_48x_0 | ch_nt_buf_repm46a_48x | ch_ntlv_buf_repm46a_48x | 25.7 | 1 |
| -824 | RISING | I27/Irepm46_48x_0 | ch_nt_buf_repm46a_48x | ch_ntlv_buf_repm46a_48x | 23.8 | 1 |
| -661 | RISING | mbist_ctl/clkhdr_stack3_39 | ch_t19_ckb_4x | NO LVT CELL | n/a | 3 |
| -661 | RISING | mbist_ctl/sram_start_check | ch_t19_fsdsreql_16x | NO LVT CELL | n/a | 3 |
| -661 | RISING | mbist_ctl/U1078 | ch_t19_buf_4x | ch_t19lv_buf_4x | 22.1 | 3 |
| -661 | FALLING | mbist_ctl/U1079 | ch_t19_inv_32x | ch_t19lv_inv_32x | 8.2 | 3 |
| -661 | FALLING | I1114/Irepm35_32x_46 | ch_nt_buf_repm35a_32x | ch_ntlv_buf_repm35a_32x | 9.8 | 3 |
| -661 | FALLING | sram_bist_ctl/U3407 | ch_t19_and4_32x | ch_t19lv_and4_32x | 8.8 | 3 |
| -661 | RISING | sram_bist_ctl/U2196 | ch_t19_inv_32x | ch_t19lv_inv_32x | 4.6 | 3 |
| -661 | FALLING | sram_bist_ctl/U942 | ch_t19_inv_32x | ch_t19lv_inv_32x | 4.1 | 3 |
| -661 | RISING | sram_bist_ctl/U1013 | ch_t19_aoi22_16x | ch_t19lv_aoi22_16x | 5.8 | 3 |
| -661 | FALLING | sram_bist_ctl/U1012 | ch_t19_and2_32x | ch_t19lv_and2_32x | 9.7 | 3 |
| -661 | RISING | sram_bist_ctl/U1283 | ch_t19_oai22_16x | ch_t19lv_oai22_16x | 7.9 | 3 |
| -661 | FALLING | sram_bist_ctl/U1418 | ch_t19_aoi22_16x | ch_t19lv_aoi22_16x | 12.8 | 3 |
| -661 | RISING | sram_bist_ctl/U1419 | ch_t19_nand4_swap_8x | ch_t19lv_nand4_swap_8x | 11 | 3 |
| -661 | FALLING | sram_bist_ctl/U1420 | ch_t19_nor3_8x | ch_t19lv_nor3_8x | 16.1 | 3 |
| -661 | RISING | sram_bist_ctl/U1432 | ch_t19_nand2_16x | ch_t19lv_nand2_16x | 8.1 | 3 |
| -661 | FALLING | sram_bist_ctl/U1612 | ch_t19_oai22_16x | ch_t19lv_oai22_16x | 7.2 | 3 |
| -661 | RISING | sram_bist_ctl/U1713 | ch_t19_inv_32x | ch_t19lv_inv_32x | 7.3 | 3 |
| -661 | FALLING | sram_bist_ctl/U1038 | ch_t19_buf_32x | ch_t19lv_buf_32x | 11 | 3 |
| -661 | FALLING | I1095/Irepm35_32x_28 | ch_nt_buf_repm35a_32x | ch_ntlv_buf_repm35a_32x | 8.3 | 3 |
| -661 | FALLING | mbist_ctl/U1371 | ch_t19_and2_32x | ch_t19lv_and2_32x | 10.3 | 3 |
| -661 | RISING | mbist_ctl/U1129 | ch_t19_inv_32x | ch_t19lv_inv_32x | 4 | 3 |
| -661 | FALLING | mbist_ctl/U1137 | ch_t19_inv_32x | ch_t19lv_inv_32x | 3 | 3 |

METHOD FOR SELECTIVELY IMPLEMENTING LOW THRESHOLD VOLTAGE TRANSISTORS IN DIGITAL LOGIC DESIGNS

FIELD OF THE INVENTION

Aspects of the invention relate generally to the field of digital logic design and more particularly to the field of high speed, low power digital microprocessor design.

BACKGROUND

In digital logic design, engineers often use pre-defined standard cells pulled from an electronic library (or database) in order to avoid constantly redesigning often used elements. These standard cells contain layouts for many logic functions and logic gates that have been carefully designed and optimized for various applications. Commonly used cells have multiple variations, including, for example, a standard cell that has been modified for maximum speed (most likely at the expense of some other circuit characteristic, such as power consumption), for minimum power consumption (again at the expense of some other characteristic), and so forth. These modified standard cells allow circuit designers more options and flexibility in creating digital circuits while still avoiding the costly procedure of redesigning cells.

Ideally, a digital logic design runs at a very high speed but consumes very little power (thereby producing very little heat). Usually, however, the faster a particular element in a design runs, the more power it consumes. Engineers must thus decide whether they want to sacrifice speed for power, or power for speed. One method commonly employed to increase propagation speeds of individual devices logic elements on a critical path (a path that needs to be optimized for speed) is to lower the threshold voltage (or, in other words, the turn-on voltage) of devices within those logic elements on the critical path (the path that needs to be optimized for speed) in a digital design. While this technique increases the switching speed of the individual devices in the logic element (thereby reducing the delay introduced into the critical path by those devices), the low threshold device consumes much more power due to the devices turning on earlier as well as the current leakage when the devices are off.

One prior art solution is to simply implement a standard cell library with non-mixed threshold voltage cells and mixed threshold voltage cells (i.e. at the transistor level) having footprints no larger than the non-mixed cells, wherein an implant overlay of oxide thickness and space between first and second threshold voltage devices match a minimum contacted space. This solution, however, fails to account for a method of intelligently selecting when to use non-mixed and when to use mixed cells in a design.

SUMMARY

One aspect of the present invention involves a method for selectively replacing standard threshold voltage devices with low threshold voltage devices in a digital logic design. The method involves identifying at least one path in a digital logic design, the at least one path having a plurality of standard threshold devices, the at least one path having a first timing value. The method further involves reverse traversing the path to identify at least one of the plurality of standard threshold devices to replace with a corresponding low threshold device. The method proceeds to determine at least one second timing value for the path associated with replacing the at least one standard threshold device with the corresponding low threshold device. Finally, depending on the outcome of the analysis, the method involves replacing the at least one standard threshold device with the corresponding low threshold device, such as when the second timing value is less than the first timing value.

Aspects of the invention may further involve a system for selectively replacing standard threshold voltage devices with low threshold voltage devices in a digital logic design. The system may involve a timing engine and other components, alone or collectively configured to obtain a first timing value for at least one path in a digital logic design, the at least one path having a plurality of standard threshold devices. The timing engine and other components further configured to reverse traverse the path to identify at least one of the plurality of standard threshold devices to replace with a corresponding low threshold device provided in a database of low threshold devices. And, the timing engine further configured to determine at least one second timing value for the path associated with replacing the at least one standard threshold device with the corresponding low threshold device in order to replace the at least one element with the corresponding element when the second timing value is less than the first timing value, or based on some other criteria.

DETAILED DESCRIPTION

Aspects of this disclosure provide systems and methods for increasing processor speed and overall performance at a reduced power consumption cost by selectively implementing Low Threshold Voltage (Low VT, or LVT) devices in place of Standard Threshold Voltage (Standard VT or SVT) devices in digital logic circuits. As described below, some aspects of this disclosure describe implementing selective SVT to LVT conversions at the device (transistor) level, as opposed to at the logic cell level, in order to more effectively increase processor speed and overall performance. Other aspects of this disclosure describe methods for optimizing mixed and non-mixed threshold logic cells through redesign (where mixed threshold cells may be cells with any variety of SVT or LVT devices, and non-mixed threshold cells have only SVT or LVT devices).

Digital logic designers constantly face the challenge of balancing demands to increase processor speed and overall performance with competing demands to reduce power consumption and heat. In order to meet specified requirements, they often tweak their designs throughout the design process. Some of these adjustments occur following a timing analysis of the design. The timing analysis results indicate, among other things, paths in a design that do not meet timing specifications and that need to be changed. As described below, so called "critical paths" are paths along which the signal propagation time exceeds the maximum propagation delay and that thus need to be optimized to reduce the delay in order to ensure timely arrival of signals. Aspects of this disclosure provide systems and methods for decreasing the propagation time of devices on critical paths, as well as other paths, by selectively implementing LVT devices in place of SVT devices, or selectively not implementing LVT devices in place of SVT devices when the corresponding LVT device is slower than its SVT counterpart.

Digital logic circuits typically include many small electronic devices, such as transistors. The transistors may be Field Effect Transistors (FET) or more specifically Metal Oxide Semiconductor Field Effect Transistors (MOSFET). These transistors are often in a complimentary arrangement known as CMOS (Complimentary Metal Oxide Semiconductor). CMOS transistors may be grouped together in various hierarchical structures. For example, several transistors may be arranged to compute the logic function of any number of inputs, and provide the result as an output. Such arrangements of transistors are often referred to as logic gates, elements, cells (logic level), and so forth. Logic gates or cells may further be grouped into more complex blocks. The complex blocks may be further arranged on a monolithic Integrated Circuit (IC), and several ICs may further be combined in order to provide some specific functionality, such as in a cell phone.

Digital logic designs may involve both clocked elements (such as flip flops, etc.) and non-clocked elements (such as NAND and NOR logic gates, inverters, etc.), and may also include discrete elements (such as capacitors, resistors, etc.). Often times in sequential logic design, several non-clocked logic elements will be placed between two or more clocked elements. Clocked elements usually require input signals to be stable a certain amount of time before the clock edge arrives (known as the setup time), and require them to be stable for a certain amount of time after the clock edge arrives (known as the hold time). Setup and hold times vary, but may be from a few nanoseconds to several hundred picoseconds for some modern flip flops. As an electronic signal leaves a first clocked element and proceeds through several non-clocked elements, propagation delays are introduced by each non-clocked element. If a large amount of delay is introduced as the signal propagates, the signal may not reach the second clocked element in a timely manner (i.e. it may violate the setup or hold time of a subsequent clocked element by arriving too close to the clock edge). This may cause the clocked element to enter a metastable state, or may result in a corrupted signal. On the other hand, if the signal arrives early enough at the flip flop in order to satisfy its setup time, and remains stable for at least the hold time (i.e. the signal arrives in a timely manner), there may be no metastability problem due to timing violations.

From the discussion above, it can be seen that the amount of time a signal takes to propagate down any given path depends on both the number and type of elements it passes through. Furthermore, the operating frequency of a design will limit the maximum propagation delay. Specifically, the sum of the maximum propagation delay and delays associated with the surrounding clocked elements (setup time, hold time, and data propagation through the clocked element) can be no greater than the inverse of the operating frequency. Hence, the term "critical path" as introduced above may thus refer to any path in a design that exceeds the maximum propagation delay.

Figure 1:
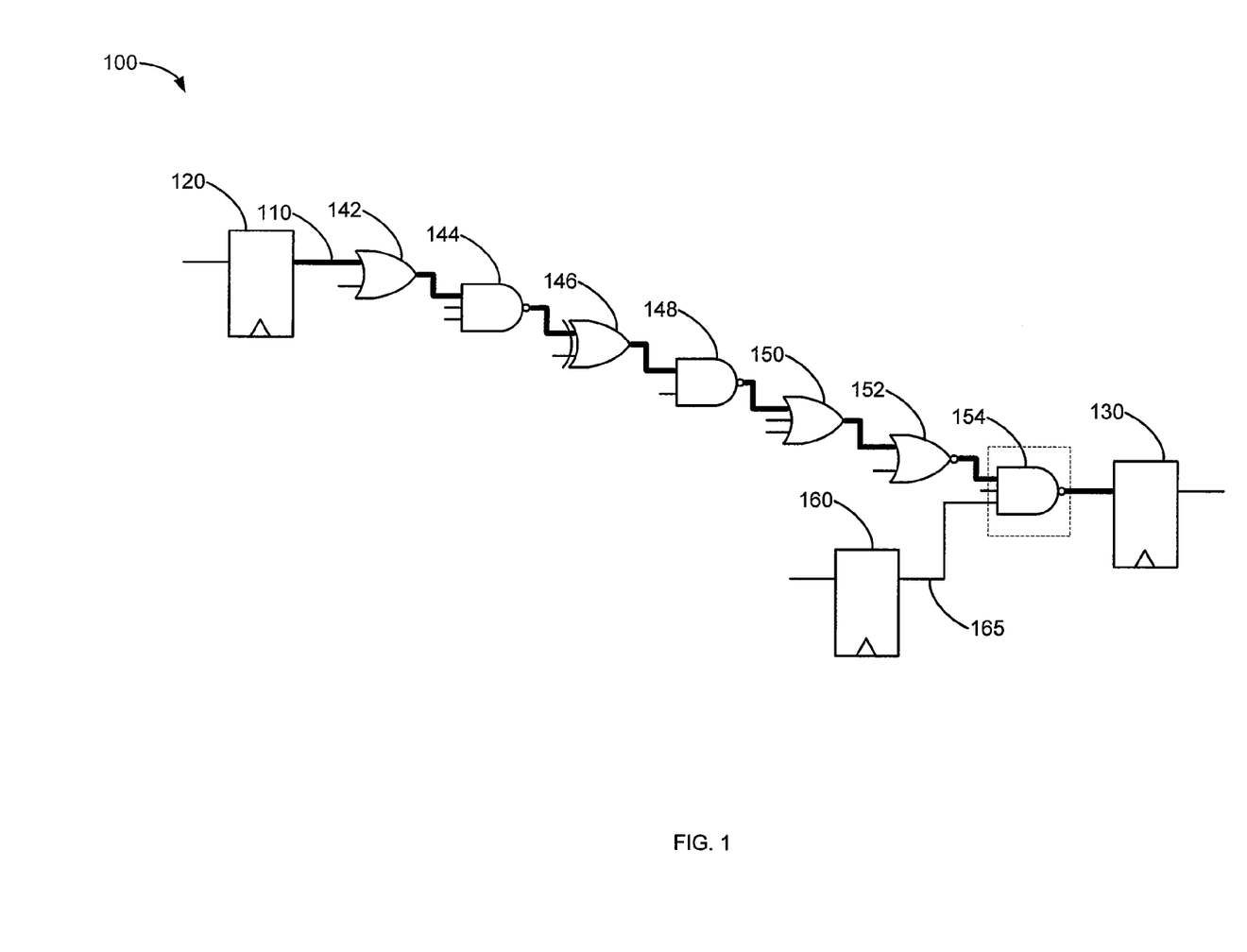
FIG. 1 illustrates a circuit diagram of a sample digital logic circuit with a critical path.

FIG. 1 shows an example of a critical path 110 (shown as a bolded line between logic elements) in a sample digital logic design 100. The critical path begins at the output of a clocked element 120, such as a flip-flop, and continues through various logic gates 142-154 until it arrives at another clocked element 130. If a large delay is introduced by elements 142-154, the signal propagating along the critical path 110 may not reach clocked element 130 in a timely manner as described above.

One way to reduce propagation delays on any given that can be done fairly late in the design process, is to increase the speed of some or all of the devices in the logic cells on that path by replacing SVT transistors with LVT transistors. LVT devices increase switching speeds of digital logic circuits by lowering the threshold voltage or the voltage required to turn a transistor 'on' (and 'off'). The delay introduced by an LVT element may be, in some cases, 20-30% shorter than the delay introduced by a corresponding SVT element. However, this delay reduction is often accompanied by side effects, such as an increase in power consumption and output conflict creation, as described below in more detail.

The delay associated with critical path 110 in FIG. 1 may be reduced by using an LVT NAND3 cell in place of the SVT NAND3 cell 154. Note that a CMOS implementation of a NAND3 gate is a combination of MOSFETs arranged to compute and output the inverse of the logical AND function of three inputs. Specifically, 3 p-type transistors are arranged in parallel and coupled to 3 n-type transistors in series. Also, the NAND3 gate is only one of a vast array of logic elements that may be implemented in a digital circuit.

Generally speaking, the threshold voltage is the voltage at which a transistor switches between on (conducting current) and off (not conducting current), and is part of the characteristics of a transistor as defined by the process technology. The threshold voltage can be adjusted in several ways, including by adjusting doping levels, dopants, oxide thickness, oxide material, and so forth. The threshold voltage of a transistor is usually considered to be the gate voltage at which an inversion layer forms at the oxide and substrate interface and the transistor conducts current sufficient to be considered 'on'. Thus, when the applied gate voltage is below the threshold voltage, the transistor is 'off', although some current may flow from drain to source (leakage current). When the applied gate voltage equals or exceeds the threshold voltage, an inversion layer is formed which conducts current between source and drain, and the transistor is 'on.'

Note that many devices, or even entire cells, are generally not considered appropriate candidates for LVT replacement because using LVT devices in place of SVT devices would likely change functionality. Such cells may include, for example, transmission gates, latches, and so forth. Other elements generally not appropriate for SVT to LVT conversion include logic elements on paths which are sensitive to noise. Generally speaking, because transistors do not turn on until the threshold voltage is reached, the threshold voltage allows for a certain amount of noise (up to the threshold voltage) on a particular node without altering performance. If a path or node is prone to receive noise that may alter performance, or if subsequent logic cells are unable to filter out glitches arising from a preceding block's increased propensity to glitch because of noise, LVT replacement may not be appropriate. Therefore, some aspects of this disclosure provide for only replacing SVT devices with LVT devices if the replacement will not cause noise problems or change functionality.

In order to take advantage of the speed increase of LVT devices while minimizing the negative side effects associated therewith, some aspects of this disclosure provide systems and methods that selectively implement LVT devices in some cells (i.e. by using LVT devices in only part of each cell while maintaining SVT devices in the other part). In addition, because the timing critical path is often only critical on either the rising or falling edge of the clock, some aspects of this disclosure only implement LVT devices for the transistors that correspond to the rising or falling signals (replacing p-type SVT transistors with their LVT counterpart improves rising time, while replacing n-type SVT transistors with their LVT counterpart improves falling time). Thus, aspects of the disclosure move the decision to do SVT to LVT conversions down to the device (transistor) level, in order to more effectively use LVT devices, thereby improving speed but avoiding some of the problems associated with LVT use described herein.

Figure 2A:
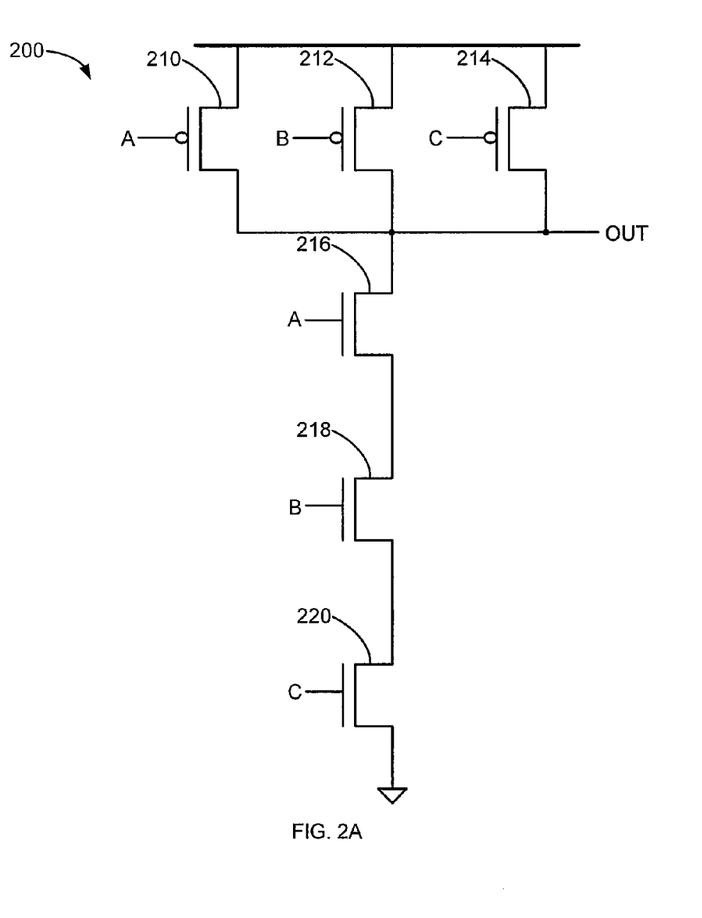
FIG. 2A illustrates a second circuit diagram of an NAND3 cell.
Figure 2B:
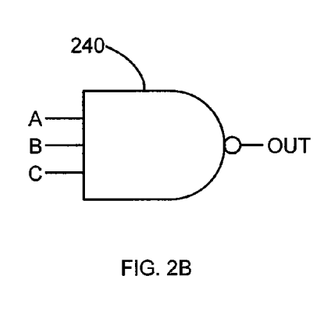
FIG. 2B shows a symbol often used to represent the NAND3 cell of FIG. 2A.
Figure 2C:
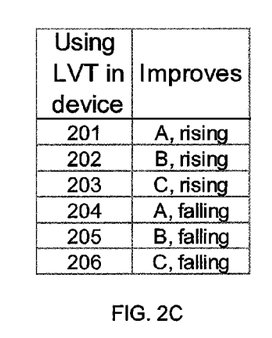
FIG. 2C is a table indicating the speed improvements that can be achieved by using one or more low voltage devices in place of standard voltage devices in the NAND3 cell of FIG. 2A.

FIGS. 2A-2C illustrate some of the effects of selectively replacing SVT devices with LVT devices at the device (instead of cell) level. More specifically, FIG. 2A shows a circuit diagram 200 of a NAND3 cell, and FIG. 2B is the logic symbol 240 for the NAND3 gate 200. FIG. 2C is a table indicating the rising or falling edge speed improvements from selectively replacing SVT devices with LVT devices in the NAND3 cell of FIG. 2A. The NAND3 FET gate 200 is one example of the NAND3 gate 154 of the circuit path in FIG. 1. For each SVT transistor replaced by an LVT transistor, there is a corresponding improvement in either the rising or falling edge of the output signal for based on each individual input signal. Replacing p-type transistor 210 with an LVT p-type transistor improves the rising time of signal A. Replacing p-type transistor 212 with an LVT p-type transistor improves the rising time of signal B. Replacing p-type transistor 214 with an LVT p-type transistor improves the rising time of signal C. Replacing n-type transistor 216 with an LVT n-type transistor improves the falling time of signal A. Replacing n-type transistor 218 with an LVT n-type transistor improves the falling time of signal B. Replacing n-type transistor 220 with an LVT n-type transistor improves the falling time of signal C.

Figure 3A:
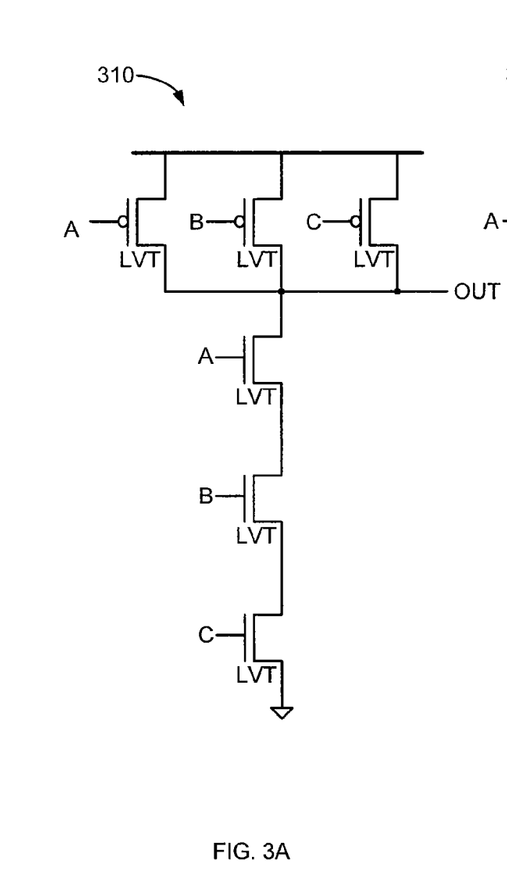
FIGS. 3A-3C illustrate a third, fourth, and fifth circuit diagrams illustrating three different implementations of a NAND3 cell with some or all devices changed to LVT transistors.
Figure 3B:
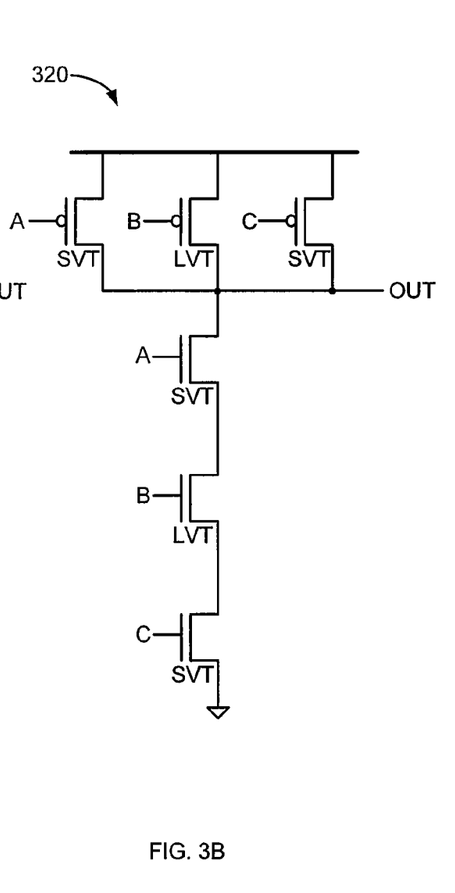
Figure 3C:
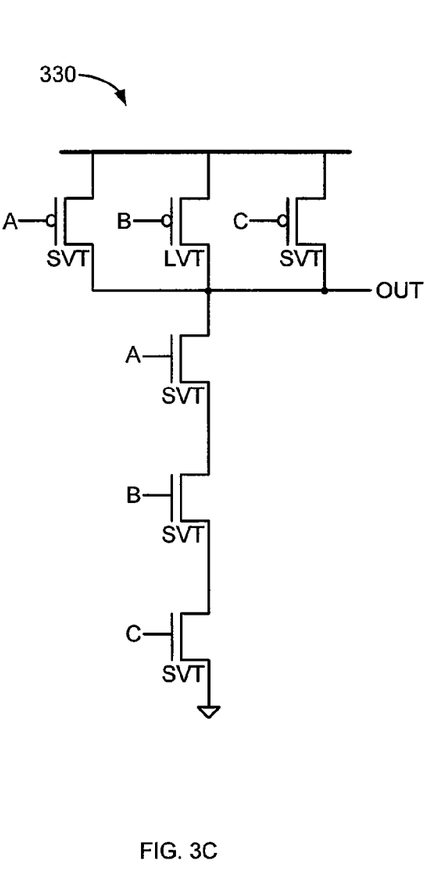

FIGS. 3A-3C show three different implementations of a NAND3 cell, each implementation with a different configuration of SVT and LVT transistors. For purposes of illustration, a NAND3 FET cell is again used. FIG. 3A shows a NAND3 cell 310 where all of the transistors have been replaced with LVT transistors. FIG. 3B shows a NAND3 cell 320 where only the transistors associated with input B have been changed to LVT. FIG. 3C shows a NAND3 cell 330 where only the p-type transistor associated with (the rising edge of) signal B has been changed to an LVT transistor. Each of these cells may be referenced in a standard cell library with their corresponding characterizations, such as the improved rising and falling time for input B associated with the NAND3 cell implementation in FIG. 3B.

Figure 4:
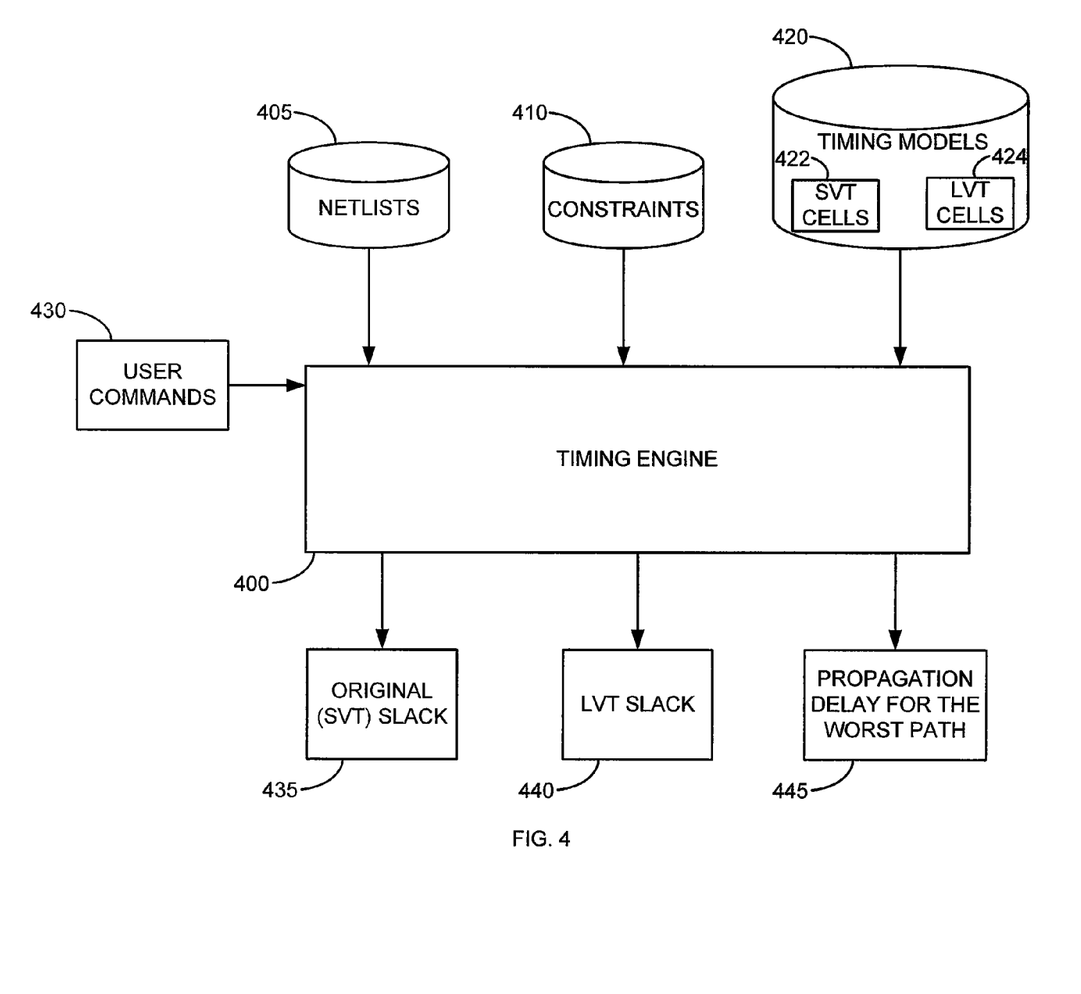
FIG. 4 is a block diagram of a timing analysis engine.

In order to intelligently select standard devices to replace with LVT devices, a timing analysis of a design with no LVT and a timing analysis of a design with full LVT is typically performed. The information generated during the timing analysis may subsequently be used to determine where LVT devices should be implemented in place of SVT devices. FIG. 4 is an illustration of a timing engine 400 that embodies one aspect of a timing analysis that generates such information. Timing engine 400 may run a simulation of the digital logic design in order to produce timing information. Timing engine 400 may take as inputs netlists 405 of circuit designs, constraints 410, timing models 420 (including SVT cell timing models 422 and LVT cell timing models 424), and user commands 430.

Netlists 405 are structural representations of digital logic circuit design. They typically describe instances of devices and elements (including transistors, capacitors, inductors, resistors, and so forth), the nets or wires that connect the devices and elements, and may also include some attributes of the devices and elements. A constraints file 410 may include, for example, design rules, timing exceptions, parasitic information, operating condition extremes, and so forth, all of which specify limitations on the design during simulation. Timing models 420 contain behavioral information for each different type of device or element in a digital logic design. The timing models are obtained by characterizing devices or elements to obtain delays, slew, skew, capacitance, setup and hold times, and other behavioral information about the device or element needed to simulate the design and obtain a timing analysis. Timing engine 400 may include timing models 420 for both SVT elements 422 and LVT elements 424.

The user commands 430 may instruct the timing analysis engine 400 to run timing analysis on the netlists 405 using either SVT cell timing models 422 or LVT cell timing models 424. If timing analysis is done for both SVT and LVT cells, the timing engine 400 outputs timing analysis information which may include, among other things, the original slack associated with each element in each path of the circuit with SVT implemented 535, the slack associated with each element in each path of the circuit with LVT implemented 440, and the propagation delay for the worst path 445. This timing analysis information may be used to determine which SVT cells to replace with either full or partial LVT cells within the circuit as shown in FIG. 5.

Figure 5:
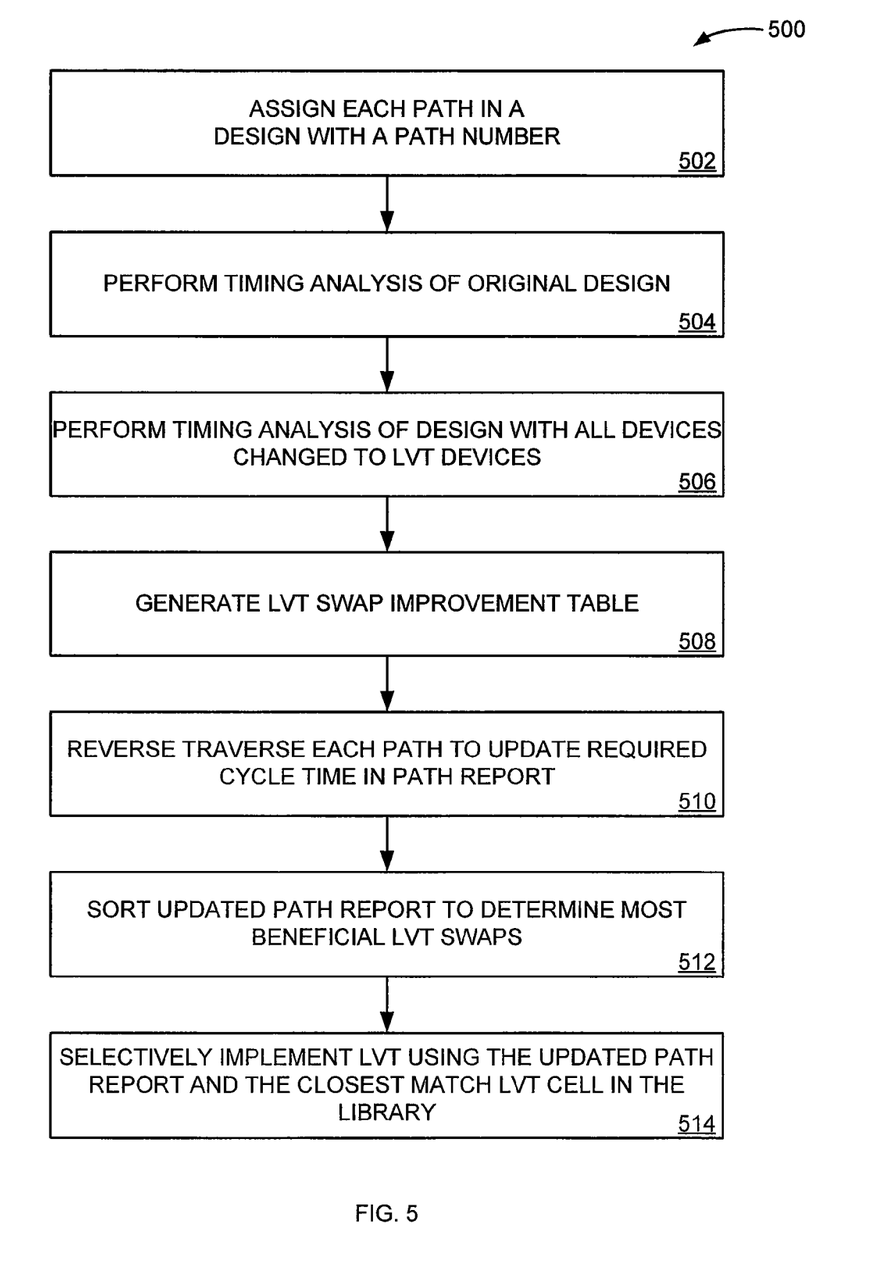
FIG. 5 illustrates a flowchart of a method for selectively implementing LVT devices based on data obtained from the timing engine.

FIG. 5 shows a flowchart of a method 500 of using the data from timing engine 400 to selectively implement partial or full LVT devices in replacement of conventional SVT devices in a digital logic design. First, each path between clocked circuit elements in a design is assigned a path number 502. Providing each path with a path number 502 provides a convenient way to step through all of the different elements and paths in a digital logic design. Assigning a path number 502 is often automatically done by timing engine 400.

Next, a timing analysis of the original design 504 (i.e. with no LVT devices) is performed using timing engine 400. The information obtained from the timing analysis 504 is the rising and falling propagation delay for each pin pair of all devices on all paths of the original digital logic design. A full chip path report may also be obtained from the timing analysis, which includes propagation times for every path in the design. In some instances, the full chip path report may be sorted by the required cycle time, and the path numbers reassigned in descending order beginning with the path having the longest propagation dely.

Every SVT device is then replaced with its corresponding LVT device, if it exists, and a timing analysis of the design with full LVT is performed 506. This second timing analysis 506 provides the rising and falling propagation delays for each pin pair of all devices on all paths of the design. An LVT swap improvement table is then generated 508, by subtracting the propagation delay of the full chip LVT timing analysis from the propagation delay of the original design for every device on every path of the design. The LVT swap improvement table is in essence a table of all of the possible timing improvements in a design.

Figure 5A:
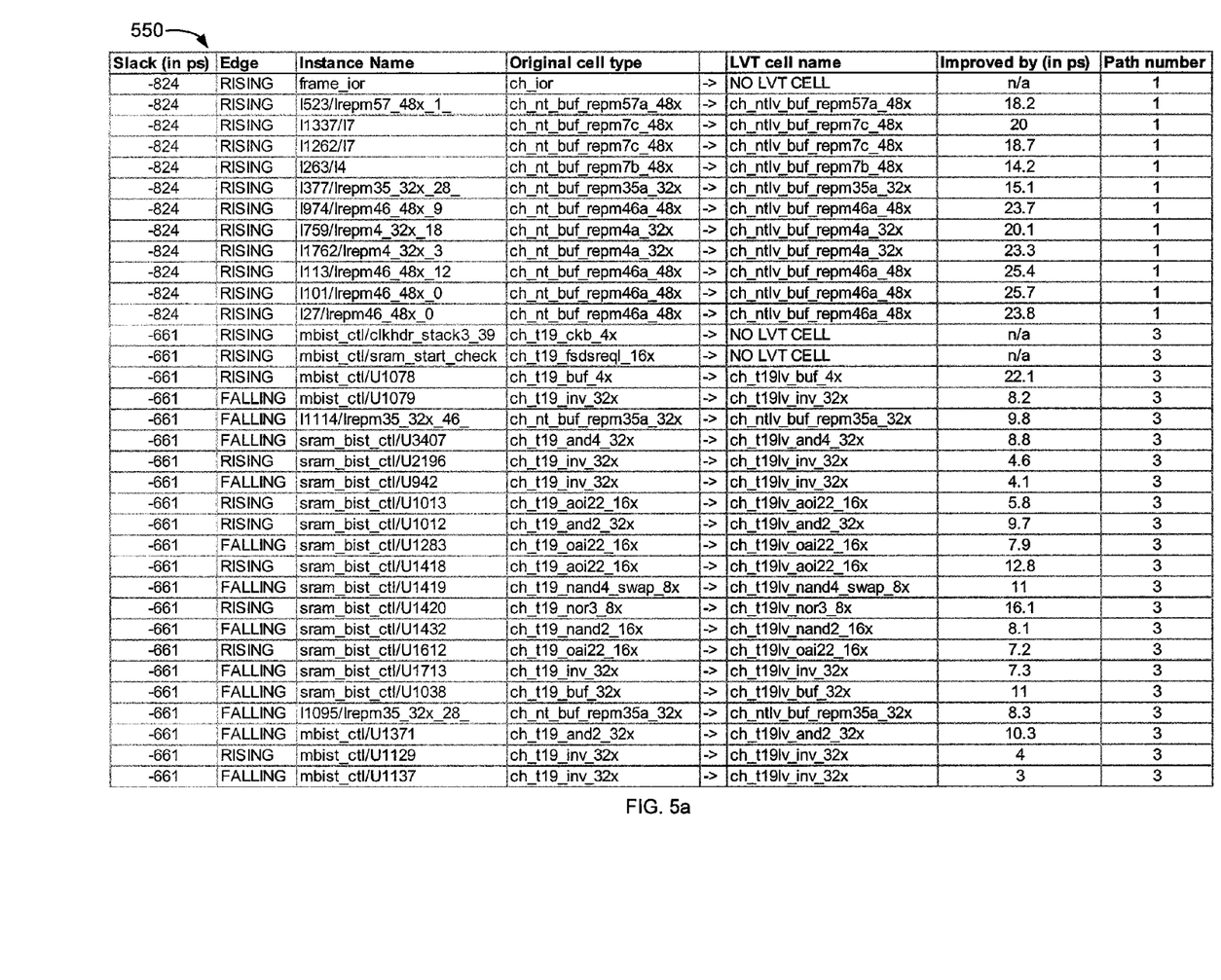
FIG. 5a is a portion of a table showing possible timing improvements if LVT is implemented in certain cells in a digital design.

FIG. 5a shows an example of an LVT swap improvement table 550. The table includes a column for the slack time, which edge the improvement in delay is for, the instance name of the cell, the original cell type, the LVT cell name, the propagation delay improvement, and the path number, where each row has data for a given cell along a path. The LVT swap improvement table in FIG. 5A is only a small sample with many edges of many cells excluded. A comprehensive LVT swap improvement table can be quite large (depending on the design, it can be several gigabytes), and thus only a sampling is shown in FIG. 5A.

Each path is then reverse traversed in order to update the cycle time for all of the paths in the digital logic design in step 504, as described in more detail below in FIG. 6. The cycle time of a given path, in one implementation, includes the propagation delay of the path, the setup and hold time of the destination flop (e.g., flop 130) and the clock skew between the source flop (e.g., flop 120) and the destination flop (e.g., flop 130) During the reverse traversal, the path report generated by timing analysis 504 is updated based on the effects of replacing each individual SVT device to an LVT device.

Finally, the updated path report is sorted in order to determine the worst cycle time (i.e., includes the longest propagation delay) as well as what will be the most beneficial LVT swaps 512 (i.e., reduces the propagation delay). For example, the table may be sorted according to the amount of time improvement gained by using LVT instead of SVT in a particular cell on a particular path. A designer using such a table may wish to implement LVT in all of the devices where there is at least a certain time gain obtained by using LVT. For example, the designer may chose to implement LVT devices whenever there is a time improvement of 6 picoseconds or more. In this way, LVT can be selectively implemented 514 to improve speed with little increased power consumption (because fewer overall SVT devices are replaced with LVT devices). In other words, LVT is selectively implemented in such a way so that timing is improved at a small expense (in terms of the negative side effects that often accompany LVT use) is incurred.

Combining the updated path report with design specifications (such as a specified operating frequency) may reveal that even if LVT is implemented everywhere appropriate, the specified operating frequency could not be reached. For example, this may be the case where a critical path with conventional SVT implemented has a propagation delay of 10 nanoseconds, the critical path with all LVT implemented has a delay of 7 nanoseconds, but the cycle period for the specified operating frequency is only 6 nanoseconds. Here, because even full LVT implementation for all devices on the path cannot bring the propagation delay down below the period, other redesign techniques are needed (such as inserting a flip flop or latch somewhere in the path). The information generated by method 500 can be used in analyzing a great deal of information about the timing of the circuit, including determining possible timing improvements.

Further, once the updated path report has been created in step 512, selectively implementing LVT in step 514 will depend on a number of factors, such as the availability of partial LVT cells in the standard cell library being used. As described below, a standard cell library may contain cells with only SVT devices, cells with only LVT devices, and cells that have some LVT and some SVT devices. There may be several different implementations of the partial LVT cells for each cell type, such as all of the n type transistors being replaced with LVT devices, all of the p type transistors being replaced with LVT transistors, only the pins associated with one or more of the inputs being replaced with LVT transistors, and so on. The circuit diagram in FIG. 3B, for example, illustrates the circuit diagram for a NAND3 cell where only the pins associated with input B are LVT devices. FIG. 3C illustrates the circuit diagram for a NAND3 cell where only the p type transistor associated with input B is an LVT device. These different implementations are examples of the many different combinations of LVT and SVT implementations that may be included in a standard cell library, each implementation having a different characterization, such as improved rising time, improved falling time, etc. Thus, the selective implementation depends greatly on the types and varieties of cells available. Cells where fewer SVT devices have been replaced by LVT devices, as opposed to cells where more or all of the devices have been switched to LVT devices, will more efficiently reduce the delay, unless there are several critical paths going through the same device (in which case the cell may be replaced with a full LVT cell). In one embodiment, step 514 involves selectively implementing LVT devices in a design based on the updated path report and using the closest match of the desired LVT cell available in the library.

Figure 6:
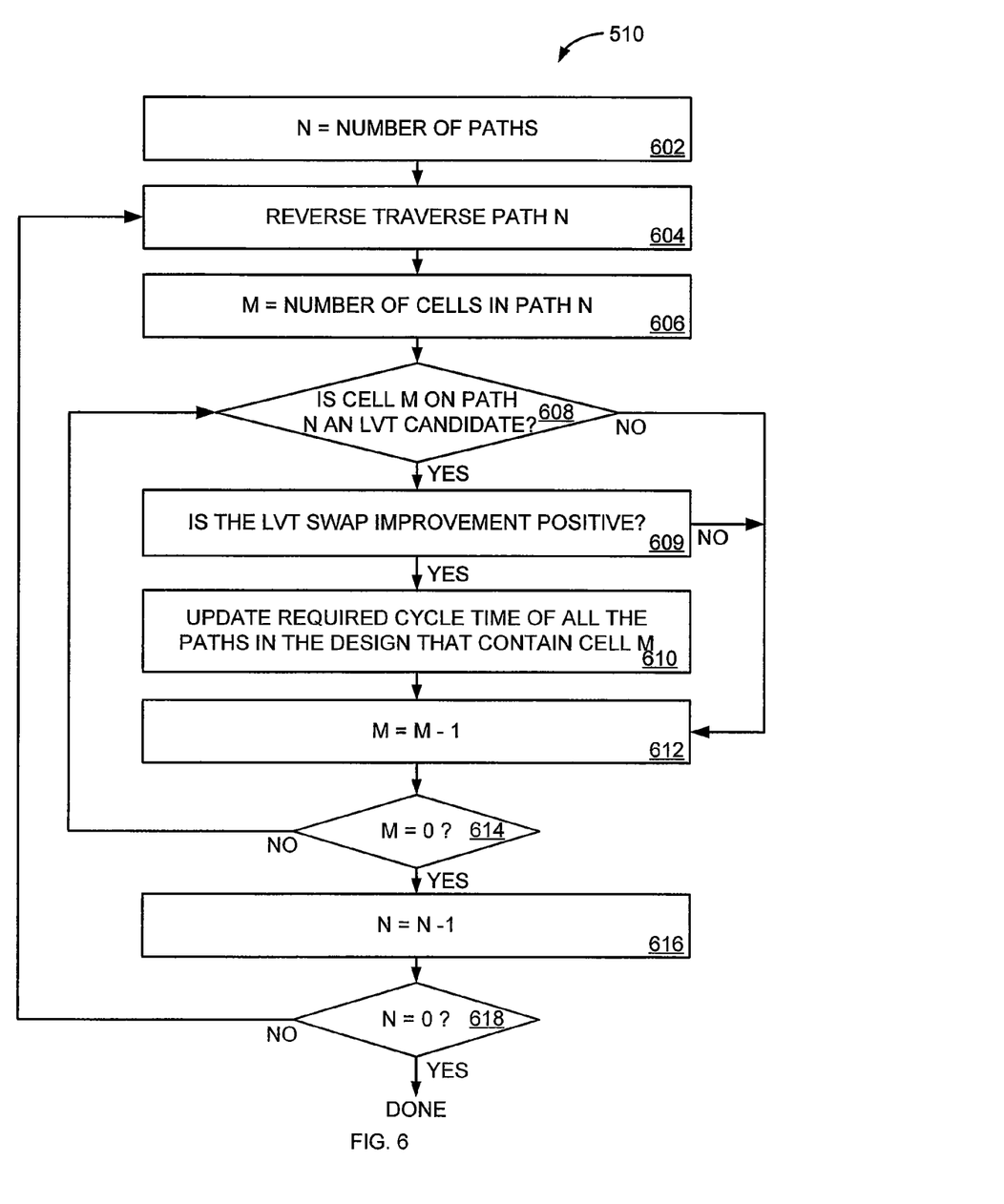
FIG. 6 illustrates a flowchart of a method for creating a table of possible timing improvements based on data obtained from the timing engine.

FIG. 6 illustrates a flowchart of a method of reverse traversing paths using timing analysis information to update the path report as previously described in step 510. This method begins by setting a variable N to the total number of paths in the digital circuit 602. Using the digital circuit in FIG. 1 as an example, N would be set to 1 because the circuit has only 1 path. FIG. 1 is referenced to provide an example of processing a circuit path according to the method of FIG. 6; however, the method is applicable to other paths.

Path N is then reverse traversed 604 as will be explained in the following steps (reverse traversal is generally a process of stepping backwards through a design). Another variable M is set to the number of cells on path N (which may be the number of non-clocked elements between two clocked elements) 606. For the digital circuit in FIG. 1, M would be set to 7, because the circuit has seven cells (142, 144, 146, 148, 150, 152, and 154) between clocked elements 120 and 130. Here, cell "M" refers to the cell "M" positions after the first clocked element (so the OR2 cell 142 is cell "1", the NAND3 cell 144 is cell "2", etc.). This referencing technique ensures that the path is reverse traversed, rather than forward traversed.

A determination is then made whether cell M is an LVT candidate 608. Recall that certain cells, such as transmission gates or latches, may not be appropriate cells to implement LVT in. In FIG. 1, the first cell to be considered is the NAND3 cell 154. Because the NAND3 cell 154 is not a cell whose functionality will change if some or all of its devices are changed from SVT to LVT, and as long NAND3 cell 154 is not on a noise sensitive path, the NAND3 cell 154 is an appropriate candidate for LVT implementation.

If cell M is not an LVT candidate, M is decremented 612 and if it is then not equal to zero 614 (i.e. there are still elements remaining on that path), the flow returns to step 608; if M is equal to zero, flow continues to step 616. If cell M is an LVT candidate, and if the LVT swap improvement is positive (i.e. the swap results in a decrease in propagation delay), then the required cycle time in the path report is updated 610 for all of the paths in that design that contain cell M. This is done because implementing LVT in a cell will likely not only affect the propagation delay for path N, but also will likely affect the propagation delay for other paths. Also, if SVT devices in a cell other than those devices associated with a critical path, or the path being reverse traversed in step 510 are replaced by LVT devices, other paths will be affected. This may be the case, for example, where the standard cell library contains limited variations or no partial LVT cells. If this is the case, other paths may need to be checked to determine the impact of the SVT to LVT replacement on those other paths.

Continuing with the example of the circuit design in FIG. 1, if the change in delay for the falling edge of the critical path 110 affected if the NAND3 cell 154 is replaced with an LVT cell is a decrease of 3 picoseconds, then the path report would be updated 610 by updating the cycle time of all of the paths in the design that contain cell 154, which in this example is only path 1.

Returning to step 609, if the LVT swap improvement is negative or does not exist, flow continues to step 612 to evaluate the next cell. M is decremented 612, and if M is then not equal to zero 614 (i.e. there are still elements remaining on that path), the flow returns to step 608. In FIG. 1, M would be decremented from 7 to 6, and the method would continue with step 608, considering cell "6" which is the NOR2 gate 152.

If M does equal zero (i.e. there are no more elements on the path), then that path reverse traversal is complete and flow continues to step 616. At step 616, N (the path number currently being traversed) is decremented. At step 618, if N is not equal to zero, there are still paths in the design that need to be reverse traversed, and flow transfers back to step 604. If N is equal to zero, there are no paths left to be reverse traversed, and the table is complete. For the circuit design in FIG. 1, there is only 1 path, and so following the calculation for elements 154, 152, 150, 148, 146, 144, and 142 (in that order), N would be decremented to zero and the method illustrated in FIG. 6 would be complete.

Once all of the paths in a design have been traversed and the path report has been updated, the path report is sorted and used to selectively implement LVT as illustrated in FIG. 5. For the FIG. 1 example, if the reverse traversal and corresponding table of timing improvements showed that replacing cells 142, 144, and 146 would result in a timing improvement of 4 picoseconds each for both rising and falling signals, replacing cells 148 and 152 would result in a timing improvement of 2 picoseconds each for both rising and falling signals, and that replacing cells 150 and 154 would result in a timing improvement of 5 picoseconds each for both rising and falling signals, the designer may wish to replace only cells 152 and 154 with a corresponding full or partial LVT cell. In this example, even though only a few of the cells were replaced with cells containing some or all LVT devices, the replacements were efficient because they were the cells where the most timing improvement was to be gained by SVT to LVT replacement.

It should be appreciated that the preceding method is an example only, and there are many steps that may be omitted, modified, or there may also be other steps introduced. For example, instead of reverse traversing each path in step 604, one aspect of this disclosure involves forward traversal of the path. Reverse traversal, however, often provides more efficient results because improving timing at the end of a path avoids the situation where earlier timing improvements get cancelled out by behavior of some intermediary element. Nonetheless, there may be situations where forward traversal provides more efficient results.

Other design considerations may also need to be considered when selectively replacing transistors, such as the need for footprint compatible cells. The footprint of a cell refers to the surface area used by the cell. Thus, an SVT to LVT footprint compatible cell is one where an LVT cell may replace with an SVT cell without violating design rules because it has a substantially similar footprint as an SVT cell. Note that there are some circuit and layout optimization techniques that can be used to realize an 'effective' size of a cell that do not affect the actual footprint of the cell; these cells would still be considered footprint compatible. Modified cells may also need to pass other design rule checks, process specific requirements, and project specific requirements.

Also, while aspects of this disclosure involve using LVT transistors in place of SVT transistors, other aspects involve selectively using high threshold voltage cells in combination with LVT and/or SVT transistors. High threshold voltage transistors, while slower than SVT and LVT transistors, consume less power, and thus may be used in paths where timing is not critical in order to decrease power consumption.

As briefly mentioned above, there are often several side effects associated with LVT usage which may motivate a circuit designer to be selective in using LVT devices. Some of the many possible side effects are increased power consumption, output conflicts, and minimum timing problems caused by LVT devices. As a result, replacing all of the transistors in a design with LVT devices is generally unacceptable. Even implementing LVT in all of the devices of an entire cell on a critical path may be disadvantageous.

One negative side effect that accompanies the increase in speed is that LVT transistors consume more power than their SVT counterparts (in contrast, high threshold voltage devices leak less current but run faster). For example, in 90 nm integrated circuit technology, LVT transistors may leak as much as 40 times more current than an SVT device. The increase in power consumption is caused by both an increased leakage current when the transistor is (supposed to be) off and by an increase in the amount of time that the transistor is on. As transistors and other electronic devices get smaller and smaller, the leakage current tends to increase and the devices may be more prone to output conflicts or timing violations.

While the increased power consumption caused by increased leakage current negatively affects the amount of energy used (particularly for logic circuits in mobile devices such as cell phones, laptops, and so forth), increased power consumption also negatively affects the operating temperature of the circuit. Much of the power used in a circuit is dissipated through heat, which causes the temperature of the circuit to increase. This temperature increase may negatively impact circuit performance by, for example, slowing down transistors or other circuit elements and preventing them from functioning correctly. Thus, although LVT is beneficial because of the decrease in propagation delay, the power and heat costs associated therewith may be one motivation to be selective in implementing LVT at both the cell and device level.

Another drawback in changing all of the transistors in an individual cell to LVT transistors when only one pin (e.g. the pin on the critical path) is problematic may be that doing so may introduce minimum delay timing problems on non-critical paths, thereby requiring a buffer to be inserted on the non-critical paths to actually increase the delay on that path. This is illustrated in FIG. 1, where the signal 165 leaving clocked element 160 goes through a logic gate 154, which for illustrative purposes is a NAND3 gate. If all of the transistors in cell 154 are replaced with LVT transistors, instead of only the transistors corresponding to the pin on the critical path, signal 165 may propagate quickly through logic gate 154, thereby causing a minimum time violation, perhaps by violating the setup or hold times for clocked element 130. Therefore, only the transistors corresponding to the pin of gate 154 that is on the critical path may be replaced with LVT transistors, leaving all of the other transistors as SVT devices, in order to avoid introducing minimum time problems.

Yet another side effect that may encourage selective rather than wholesale implementation of LVT is that LVT transistors may cause problems by introducing output conflicts which not only propagate to subsequent cells but can also drastically increase power consumption. An example of an output conflict is a situation where a pull up transistor (usually p-type) and a pull down transistor (usually n-type) coupled together in a cell are both on, establishing a conducting path from the power supply to ground and leaving the output voltage unstable. The indeterminate output voltage may cause the transistor and subsequent transistors to enter a metastable state.

Such output conflicts often result when SVT cells are converted to LVT cells in the conventional manner, specifically by using SVT cells that have been created and optimized for SVT devices and merely changing some or all of the SVT devices to LVT devices. This change, unaccompanied by any other modifications, may introduce unwanted side effects, such as the output conflicts described above. These side effects may be mitigated by redesigning the cell or the individual devices within the cell in order to optimize performance and minimize the negative effects introduced by the SVT to LVT change.

Redesign may include, but is not limited to, resizing the transistors and rearranging the circuit topology. For example, consider the NAND3 gate 710 with some SVT and some LVT devices in FIG. 7A. In particular, transistors 732 and 738 are LVT devices, while transistors 730, 734, 736, and 740 are SVT devices. This gate may have been created using a standard SVT NAND3 gate and simply changing some of the SVT devices to LVT devices. A problem arises if the LVT p-type transistor 732 has a longer than necessary conflict with the corresponding 738 n-type transistor, or either of the other two n-type transistors 736 or 740, which prevents the output 750 from settling until the conflict is resolved.

Figure 7A:
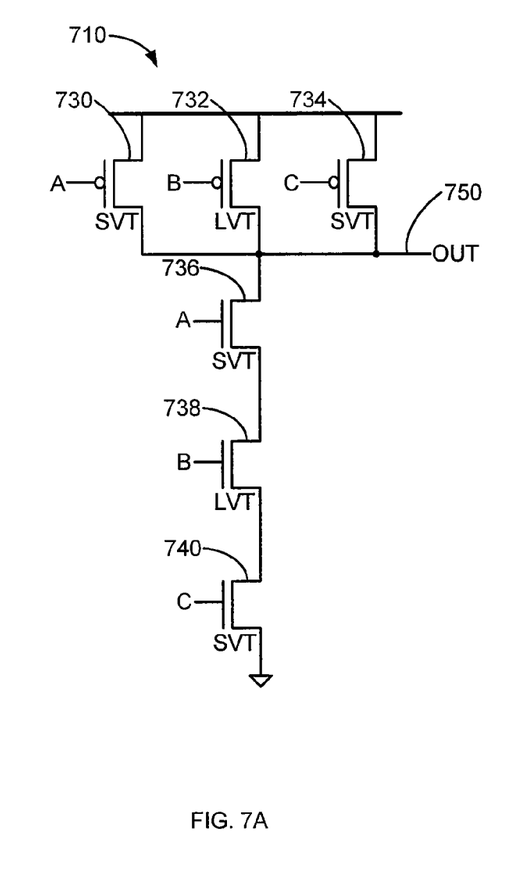
FIG. 7A illustrates a sixth circuit diagram illustrating a NAND3 cell that has only been modified by replacing some SVT transistors with LVT transistors.
Figure 7B:
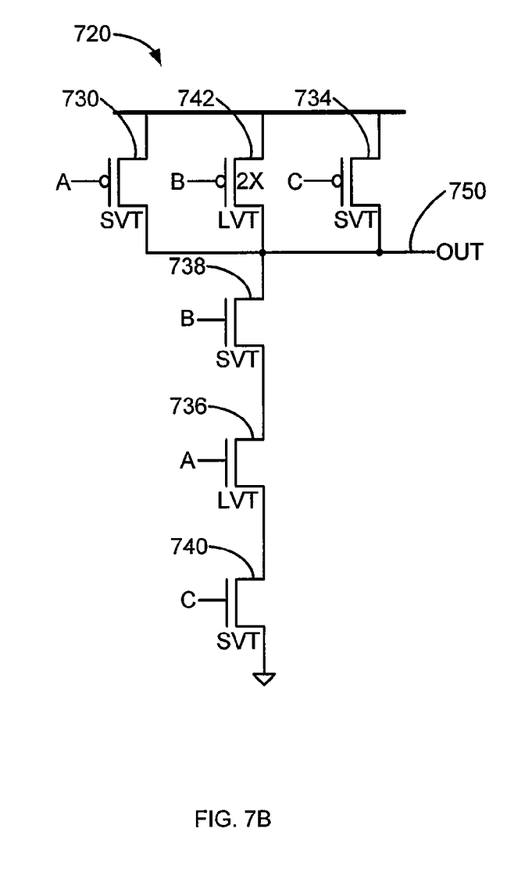
FIG. 7B illustrates the NAND3 cell of FIG. 7A wherein the cell has been further modified to improve performance.

The indeterminate output problem of the NAND3 cell in FIG. 7A might be solved by doubling the size of the p-type transistor 742 that was changed to LVT and at the same time changing the topology of the n-type transistors 738 and 736 as shown in FIG. 7B.

Similarly, SVT to LVT replacement often times results in a cell whose output is skewed. In other words, using LVT in a cell may only improve the propagation delay for either the rising or the falling output, with the output for the other clock edge is actually degraded. This problem is exacerbated when the input slew rate is worse than normal, as is often the case in critical paths of digital logic circuits.

If a cell has a degraded rising output after partial or full LVT replacement, the size of n type transistor associated with the pin for that output may need to be reduced (or the size of the p type transistor associated with that pin may need to be increased). If the falling output is degraded, after partial or full LVT replacement, then the size of the p type transistor associated with the pin for that output may need to be reduced (or the size of the n type transistor associated with that pin may need to be increased if space allows). Determining how much redesigning to do may, however, depend on how bad the expected input skew rate is.

Note that there are several phases of circuit design where cell redesign may be appropriate. Some aspects of this disclosure involve redesigning full LVT and partial LVT cells by individual circuit designers during design. Other aspects involve cell redesign at the library level, before individual circuit design. If the cells are redesigned at the library level, individual designers are spared the effort associated with redesign, which may be significant. However, even cell redesign at the library level is likely to involve many hours of human effort and may not be practicable. Thus, other aspects of this disclosure involve partial redesign at the library level and continuing the redesign process in individual circuit designs.

As mentioned above, in step 508 in FIG. 5, actually replaced SVT devices with LVT devices depends greatly on the availability of full LVT and partial LVT cells in the standard cell library. Accordingly, some aspects of this disclosure relate to a generalized standard cell library with full SVT, partial LVT, and full LVT cells (full SVT and full LVT cells may alternatively be called non-mixed threshold voltage cells, and partial LVT cells may alternatively be called mixed threshold voltage cells) all of which have been designed or redesigned to optimize performance. In theory, it is possible to construct a comprehensive library with all of the different combinations of SVT and LVT devices within each and every different type of cell. However, the overhead associated with creating and maintaining such a vast library is likely prohibitive. This is demonstrated by considering all of the possibilities that a standard NAND3 gate may entail: all 6 transistors being SVT, 5 transistors being SVT and 1 being LVT, 4 transistors being SVT and 2 being LVT, etc. Furthermore, there are multiple permutations of these cells, i.e. the first 5 transistors being SVT and the last being LVT, the first 4 and last 1 transistors being SVT and the second to last transistor being LVT, etc. And the NAND3 gate is only one of thousands of different logic gates. Furthermore, in order to optimize performance, each different version should be redesigned after replacing some or all SVT devices with LVT devices.

There is thus a need to balance the library overhead with the needed speed improvement and power savings. Some instances, such as where there is an extreme need to optimize speed and power consumption, may justify considerable effort in constructing a comprehensive library. The extra expense of library construction may also be justified in the case of the most often used cells, such as the standard buffer and inverter. In other situations, the redesign of the hundreds or thousands of different standard library elements may be left up to individual designers on an as needed basis.

While all different combinations and permutations of SVT and LVT devices within cells is within the scope of this disclosure, one implementation simplifies the complexity associated with a comprehensive library by only having a few of the SVT/LVT combinations.

One implementation of a simplified standard library includes one version of each cell with all SVT devices, one version with all LVT devices, and one version with only the transistors associated with one pin being LVT devices (i.e. the n and p type transistors associated with that one pin). Using this implementation, the choice in step 508 may be to use the one-pin LVT cell if only one pin of a cell in question is on a critical path, use the full LVT cell if at least two pins of the cell are on critical paths, or use the full SVT cell if no pins of that cell are on the critical path.

Another implementation of the simplified standard library includes one version of each cell with only one SVT p type transistor replaced with an LVT p type transistor, and one version with only one SVT n type transistor replaced with an LVT n type transistor. Other implementations may include any other combination of SVT and LVT devices within the cells. Any of these limited standard libraries are still extremely flexible and adapted to the needs of high speed, low power digital logic circuit design when used in connection with pin swapping techniques.

Pin swapping techniques allow for the inputs to a cell to be switched after place and route without having to rearrange the contents of the cell. However, because of the effort that is likely associated with pin swaps after place and route (such as making sure the pin swap doesn't change any subsequent functionality or introduce new timing problems), some aspects of this disclosure involve carefully implementing partial LVT cells during the design phase and before place and route. Such careful implementation may include, but is not limited to, using characterization information for the partial LVT cell contained in the cell library to determine which pin is the fastest pin in the cell, and using the transistors associated with that pin for signals on what will most likely be a critical path. Other aspects of this disclosure, however, involve pin swapping after place and route, and after timing analysis has been performed.

The invention claimed is:

1. A method for selectively replacing standard threshold voltage devices with low threshold voltage devices in a digital logic design, comprising the operations of:
   identifying at least one path in a digital logic design, the at least one path having a plurality of standard threshold voltage devices, the at least one path having a first timing value determined by a timing engine;
   reverse traversing the path to identify at least one of the plurality of standard threshold voltage devices to replace with a corresponding low threshold voltage device, wherein the low threshold voltage device has a lower threshold voltage needed to activate the device than the standard threshold voltage device;
   determining, utilizing the timing engine, at least one second timing value for the path associated with replacing the at least one standard threshold voltage device with the corresponding low threshold voltage device; and
   replacing the at least one standard threshold voltage device with the corresponding low threshold voltage device when the second timing value is less than the first timing value.

2. The method of claim 1 wherein the at least one path is a critical path in the digital logic design.

3. The method of claim 2 wherein the critical path has the first timing value including a propagation delay of the plurality of standard threshold voltage devices of the critical path and the digital logic design has a maximum allowable propagation delay; and
   wherein the operation of replacing reduces the propagation time on the at least one critical path below the maximum allowable propagation delay.

4. The method of claim 1 wherein the operation of reverse traversing the path further comprises:
   determining that the at least one of the plurality of standard threshold voltage devices is not susceptible of replacement.

5. The method of claim 1 wherein the first timing value is a path cycle time including a propagation delay of each of the plurality of standard threshold voltage devices of the at least one path, a setup and hold time of a destination flop in the at least one path, and a clock skew between a source flop and a destination flop of the at least one path.

6. The method of claim 1 further comprising the operation of:
   identifying first standard threshold voltage device at a beginning of the at least one path and a second standard threshold voltage device at the end of the at least one path; and
   wherein the operation of reverse traversing the at least one path begins with the second standard threshold voltage device and ends with the first threshold voltage device in order to prioritize the second standard threshold voltage device over other standard threshold voltage devices along the at least one path for replacement.

7. The method of claim 6 wherein the beginning of the at least one path includes a non-clocked element immediately following a first clocked element, and the end of the at least one path includes an element immediately preceding a second clocked element.

8. The method of claim 1, further comprising:
   wherein the first timing value corresponds with a propagation delay introduced by the plurality of standard threshold voltage devices;
   wherein the second timing value corresponds with a second propagation delay introduced by replacing the at least one standard threshold voltage device with the corresponding low threshold voltage device;
   generating a table including an indication of the at least one path and a timing difference between the first and the second timing values along with timing differences for other paths sorting the table based on the timing differences; and
   replacing only those standard threshold voltage devices where replacement with the corresponding low threshold voltage device will result in the timing value reduction meeting a predetermined value.

9. The method of claim 1 wherein the standard threshold voltage device further comprises a plurality of p-type devices; and
   wherein a plurality of p-type devices in the corresponding low threshold voltage device are replaced by low threshold voltage p-type devices in order to reduce the rising time of the corresponding element.

10. The method of claim 1 wherein:
    the standard threshold voltage device further comprises a plurality of n-type devices; and
    wherein a plurality of n-type devices in the corresponding low threshold voltage device are replaced by low threshold voltage n-type devices in order to reduce the falling time of the corresponding element.

11. The method of claim 1 wherein the standard threshold voltage device further comprises at least one n-type device and at least one p-type device, the at least one n-type device and at least one p-type device corresponding to at least one input; and
    wherein only the n-type and p-type standard threshold voltage devices corresponding to the at least one input are replaced by low threshold voltage devices in order to reduce the rising and falling time associated with the at least one input.

12. The method of claim 1 wherein the standard threshold voltage device further comprises a plurality of devices; and
    wherein all of the devices in the corresponding low threshold voltage device are replaced by low threshold voltage devices.

13. A system for selectively replacing standard threshold voltage devices with low threshold voltage devices in a digital logic design comprising:
    a timing engine configure to obtain a first timing value for at least one path in a digital logic design, the at least one path having a plurality of standard threshold voltage devices;
    the timing engine further configured to reverse traverse the path to identify at least one of the plurality of standard threshold voltage devices to replace with a corresponding low threshold voltage device provided in a database of low threshold voltage devices, wherein the low threshold voltage device has a lower threshold voltage needed to activate the device than the standard threshold voltage device;

the timing engine further configured to determine at least one second timing value for the path associated with replacing the at least one standard threshold voltage device with the corresponding low threshold voltage device in order to replace the at least one element with the corresponding element when the second timing value is less than the first timing value.

14. The system of claim 13, the timing engine further configured to identify a first standard threshold voltage device at a beginning of the at least one path and a second standard threshold voltage device at the end of the at least one path; and wherein the operation of reverse traversing the at least one path begins with the second standard threshold voltage device and ends with the first threshold voltage device in order to prioritize the second standard threshold voltage device over other standard threshold voltage devices along the at least one path for replacement.

15. The system of claim 14 wherein the beginning of the at least one path includes a non-clocked element immediately following a first clocked element, and the end of the at least one path includes an element immediately preceding a second clocked element.

16. The system of claim 13 wherein:

the first timing value corresponds with a propagation delay introduced by the plurality of standard threshold voltage devices;

the second timing value corresponds with a second propagation delay introduced by replacing the at least one standard threshold voltage device with the corresponding low threshold voltage device;

the timing engine configure to:

generate a table including an indication of the at least one path and a timing difference between the first and the second timing values along with timing differences for other paths;

sort the table based on the timing differences; and replace only those standard threshold voltage devices where replacement with the corresponding low threshold voltage device will result in the timing value reduction meeting a predetermined value.

17. The system of claim 13 wherein:

the standard threshold voltage device further comprises a plurality of p-type devices; and a plurality of p-type devices in the corresponding low threshold voltage device are replaced by low threshold voltage p-type devices in order to reduce the rising time of the corresponding element.

18. The system of claim 13 wherein:

the standard threshold voltage device further comprises a plurality of n-type devices; and a plurality of n-type devices in the corresponding low threshold voltage device are replaced by low threshold voltage n-type devices in order to reduce the falling time of the corresponding element.

19. The system of claim 13 wherein the standard threshold voltage device further comprises:

at least one n-type device and at least one p-type device, the at least one n-type device and at least one p-type device corresponding to at least one input; and wherein only the n-type and p-type standard threshold voltage devices corresponding to the at least one input are replaced by low threshold voltage devices in order to reduce the rising and falling time associated with the at least one input.

20. The system of claim 13 wherein:

the standard threshold voltage device further comprises a plurality of devices; and all of the devices in the corresponding low threshold voltage device are replaced by low threshold voltage devices.

* * * * *